United States Patent
Kanoh et al.

(10) Patent No.: US 6,495,456 B1
(45) Date of Patent: Dec. 17, 2002

(54) METHOD OF MANUFACTURING CHIP TYPE ELECTRONIC PARTS

(75) Inventors: Osamu Kanoh, Omihachiman; Yasushi Yoshida, Shiga-Ken; Yoshifumi Ogiso, Otsu, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/416,294

(22) Filed: Oct. 14, 1999

(30) Foreign Application Priority Data

Oct. 20, 1998 (JP) .......................................... 10-298900

(51) Int. Cl.$^7$ .............................................. H01L 21/44
(52) U.S. Cl. ........................................ 438/678; 438/652
(58) Field of Search ................................. 438/652, 678

(56) References Cited

U.S. PATENT DOCUMENTS

| | | | | |
|---|---|---|---|---|
| 4,011,980 A | * | 3/1977 | Dvorak et al. | 228/180 |
| 4,993,559 A | * | 2/1991 | Cota | 211/41 |
| 5,746,809 A | * | 5/1998 | Kanoh et al. | 106/1.11 |

FOREIGN PATENT DOCUMENTS

JP 9272980 10/1997

OTHER PUBLICATIONS

Japanese Examination Report dated Jun. 4, 2002, along with the English translation.

* cited by examiner

Primary Examiner—Wael Tabossy
Assistant Examiner—William M. Brewster
(74) Attorney, Agent, or Firm—Ostrolenk, Faber, Gerb & Soffen, LLP

(57) ABSTRACT

A method of manufacturing chip type electronic parts, comprises the steps of: applying a photo-active catalyst liquid to chip substrates to form a photo-sensitive film consisting of the photo-active catalyst liquid on the chip substrates; arranging the chip substrates with respect to a light source in a manner such that portions of the chip substrates on which electrodes are to be formed will become light irradiation portions; irradiating the chip substrates with a light so as to activate irradiated portions of the photo-sensitive film; dipping the chip substrates in an electroless plating bath and precipitating a plating metal on said activated portions.

5 Claims, 5 Drawing Sheets

METHOD OF MANUFACTURING CHIP TYPE ELECTRONIC PARTS

BACKGROUND OF THE INVENTION

1. Field of the Invention

The present invention relates to a method of manufacturing chip type electronic parts, more particularly a method of forming terminal electrodes on main bodies of chip type electronic parts.

2. Description of the Related Art

With advancement in packaging techniques, electronic parts such as laminated condensers, laminated coils, LC filters, thin film coils, high frequency antennas, and EMI filters have been quickly improved to have a chip component shape. With the chips becoming more and more compact, it is difficult to form terminal electrodes on the surfaces of the electronic parts with a high degree of precision.

The following process has been used to form terminal electrodes of chip type electronic parts. A thick film paste is applied to the surfaces of the electronic parts using a screen printing method or a transferring method, then, a burning treatment is performed so as to form terminal electrodes on the chip type electronic parts (this will be hereinafter referred to as "conventional art 1"). However, when the screen printing or the transferring methods are used to form the terminal electrodes, the paste for the terminal electrodes are likely to be formed into a hemisphere shape on the end face of the chip type electronic part. This frequently causes the chip type electronic part to rise up above the surface to which it is being soldered during the soldering process. Further, since it is necessary to perform the burning treatment, the above method cannot be used to manufacture electronic parts formed from a material such as an electrically insulating organic resin which exhibits a high resistance to heat.

Another conventional method for applying the electrodes uses a metallic mask which is attached to one of the surfaces of the electronic part and applies the terminal electrodes by way of a sputtering method or the like (this will be hereinafter referred to as "conventional art 2"). However, in this process, a clearance must be provided between the metal mask and the surface of the electronic parts with the result that sputtering ions get into such clearance, making it difficult to form terminal electrodes having a microstructure.

In order to overcome the foregoing problems, research has been conducted to develop a method of forming terminal electrodes by way of electroless plating. According to this method, the entire surfaces of the electronic parts are first coated with an active catalyst liquid consisting of tin chloride and palladium chloride and the like. After that, the chip parts are dipped in an electroless plating bath so as to precipitate the plating metal on the entire surfaces of the chip parts. Subsequently, a photoresist layer is formed on the surfaces of the chip type electronic parts and a patterning process is conducted by means of light exposure using a photo-mask, followed by an etching treatment to remove undesired portions of the plating metal, thereby forming the terminal electrodes (this will be hereinafter referred to as "conventional art 3").

According to this method, it is possible to uniformly form terminal electrode layers on the surfaces of the electronic parts without having to perform a burning treatment on the substrates thereof. Further, it avoids the foregoing problem associated with the conventional art 2 (i.e. sputtering ions invade the clearance formed between the metal mask and the surfaces of the electronic parts).

However, the conventional art 3 has the following problems. Since it is necessary to remove portions of the plating metal by means of etching treatment, this method can not be used in manufacturing electronic parts which are made of a material apt to be damaged by this etching treatment.

In addition, with regard to chip type electronic parts of surface mounting type, it is necessary that the terminal electrodes be formed in a U-shaped configuration such that the end portions of the substrates may be surrounded by said terminal electrodes. However, with conventional art 3, when terminal electrodes having the U-shaped configuration are to be formed, it is necessary to repeatedly carry out a process involving the use of photolithography technique and etching removal of the plating metal from the surfaces of chip substrates, on each side of the electronic part making the process complex.

BRIEF DESCRIPTION OF THE INVENTION

The present invention can solve the aforementioned problems associated with the conventional art and is directed to a method of producing terminal electrodes with the use of a simplified process, which is capable of uniformly and thinly forming terminal electrodes on the surfaces of chip type electronic parts, making it possible to manufacture terminal electrodes having a microstructure, without bringing about any damage to the surfaces of the electronic parts.

The method of manufacturing chip type electronic parts, comprises the steps of: applying a photo-active catalyst liquid to chip substrates to form a photo-sensitive film consisting of the photo-active catalyst liquid on the chip substrates; arranging the chip substrates with respect to a light source in a manner such that portions of the chip substrates on which electrodes are to be formed will become light irradiation portions; irradiating the chip substrates with a light so as to activate irradiated portions of the photo-sensitive film; dipping the chip substrates in an electroless plating bath and precipitating a plating metal on said activated portions.

According to the present invention, it is possible to uniformly and thinly forming terminal electrodes on the surface of chip substrates, making it possible to manufacture terminal electrodes having a microstructure, without bringing about any damage to the surfaces of the electronic parts.

Further, according to the present invention, chip substrates are arranged in a manner such that portions of the chip substrates on which electrodes are to be formed will become light irradiation portions, an electroless plating is conducted on the irradiated portions so as to form electrodes thereon. In this way, by improving the method of arranging the chip substrates, it is possible to form U-shaped terminal electrodes on the chip substrates, thereby rendering the process to become extremely simple.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Figure 1:
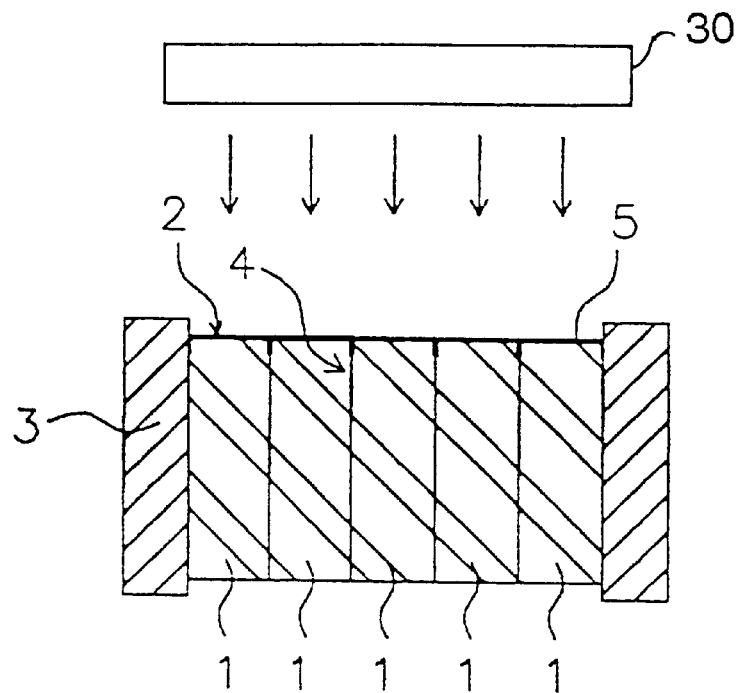
FIG. 1 is a cross sectional view showing a first embodiment of the present invention wherein a plurality of arranged chip substrates are irradiated by a light.

A method of manufacturing chip type electronic parts according to a first embodiment of the present invention, comprises the steps of applying a photo-active catalyst liquid to chip substrates to form a photo-sensitive film made from the photo-active catalyst liquid on the chip substrates, arranging the chip substrates in a manner such that portions of the chip substrates on which electrodes are to be formed will become light irradiation portions, irradiating the chip substrates with a light so as to activate irradiated portions of the photo-sensitive film, dipping the chip substrates in an electroless plating bath and thus precipitating a plating metal on said activated portions.

According to the preferred embodiments of the present invention, the photo-sensitive film made form a photo-active catalyst liquid is formed on the entire surfaces of the chip substrates, a light irradiation is performed and irradiated portions of the photo-sensitive film are selectively activated, subsequently a plating metal is precipitated on the activated portions. Therefore, it is not necessary to perform an etching treatment on the plating metal as required in the above conventional art 3, thereby avoiding a damage to the chip substrates.

Further, the chip substrates are preferably arranged to be orientated in an identical direction with end faces of the chip substrates facing outwardly in an identical direction to be exposed to the light source.

The irradiation light may be a substantially parallel (this includes a parallel) ultraviolet light beam. Under such a condition, only the end faces of the chip substrates which are orientated in a direction perpendicular to the irradiation light are exposed, the main faces of the chip substrates arranged to extend parallel to the irradiation light will not be exposed. Further, in a case when the irradiation light is a nonparallel light, the main faces of the chip substrates will be partially exposed. However, since the ultraviolet light will be attenuated because of being absorbed by a gas such as air, only a portion of the main faces of the chip substrates will be exposed. Particularly, only the portions of the main faces where the terminal electrodes are to be formed will be exposed. For this reason, it is possible to form U-shaped terminal electrodes capable of packaging.

However, chip type electronic parts are usually so made that each of them has a chamfer portion. If these types of chip type electronic parts are arranged such that their end faces are orientated outwardly (in an identical direction) so as to be exposed, and if the end faces are exposed to the irradiation light, both the end faces are the chamfer portions will be exposed. Therefore, in a case when the chip type electronic parts having the chamfer portions are utilized, it is possible to form the U-shaped terminal electrodes with a single exposure of the irradiation light.

Further, a plurality of chip substrates may be arranged in an inclined manner such that both an end surface and a portion of one main surface of each chip substrate is exposed. If the chip substrates are arranged in this manner, it is possible to selectively activate the areas on which photo-sensitive films are desired, and it is possible to freely change the areas of the terminal electrodes to be formed on the side faces of the chip substrates.

In another embodiment, a photo-mask is used to selectively activate the photo-sensitive film. In this case, it is possible to freely change the number and shape of the terminal electrodes by selecting the configurations of the light transmissible portions of the photo-mask to be used.

Alternatively, a laser beam may be used as the irradiation light so as to selectively activate the photo-sensitive film. With this embodiment, it is possible to freely change the number and shape of the terminal electrodes by selectively irradiating desired areas with the laser beam.

According to the present invention, it is possible to form the terminal electrodes without having to perform an etching treatment when forming such terminal electrodes. Further, by improving a method of arranging the chip substrates, it is possible to use a simple process to form U-shaped terminal electrodes on the chip substrates.

Hereinafter, the preferred embodiments of the present invention are explained in detail with reference to the drawings.

EXAMPLE 1

The embodiments of the present invention will be described with reference to FIG. 1 and FIG. 2.

First, chip substrates consisting of a ceramic material such as barium titanate or titan oxide are either dipped in a hydrophilic photo-active catalyst liquid or are coated with the hydrophilic photo-active catalyst liquid by first changing said liquid into a mist like medium and then spraying them on to the surfaces of the substrates, followed by a drying treatment, thereby obtaining a photo-sensitive film made from the photo-active catalyst liquid. Here, as the photo-active catalyst liquid, it is possible to use a hydrophilic photo-active catalyst liquid consisting of zinc oxalate or zinc lactate, copper oxalate or copper lactate, palladium chloride and an aqueous ammonia.

Then, as shown in FIG. 1, a plurality of chip substrates 1 are arranged with respect to a light source 30 in a manner such that the end faces 2 of all the chip substrates are orientated in the same direction with the chip substrates being fixed on a holder 3 and the outside surface being exposed. The chip substrates 1 may be arranged such that their lateral side faces 4 are in contact with one another without any spacing therebetween. Alternatively, the chip substrates may be arranged with spaces therebetween. However, it is preferred that the chip substrates be arranged without any spaces formed between them, since such an arrangement makes it possible to maximize the number of chip substrates within the holder 3, thereby ensuring a high processing efficiency.

Next, the chip substrates are irradiated with light by light source 30, so as to precipitate an active palladium catalyst on the irradiated portions of the photo-sensitive film (the precipitated portions of the palladium catalyst are represented by a thick line 5). More particularly, an ultraviolet light from an exima lamp (wave length: 172 nm, 222 nm or 308 nm) is preferably used to perform the irradiation with a light exposure amount of 50 mJ/cm$^2$.

At this moment, if the irradiation light is made to be an extremely parallel light beam, only the end faces 2 of the chip substrates which are orientated in a direction perpendicular to the irradiation light are exposed, while the lateral side faces 4 of the chip substrates arranged in parallel with the irradiation light will not be effected by the light exposure (in the case shown in FIG. 1, since the chip substrates are arranged without forming any clearance between them, the side faces 4 will not be exposed under any condition, but even if the chip substrates are arranged with clearances formed between them, it is still possible that the side faces 4 can be prevented from being exposed in this manner).

If the irradiation light contains non-parallel light and spaces are formed between adjacent chip substrates, the side faces 4 will be partially exposed. However, since ultraviolet light is apt to attenuate due to its being absorbed by a gas such as air, the light exposure will only occur partway down the side of the side faces 4. As a result, only that portion of the side faces 4 which are suitable for the formation of a terminal electrode will be exposed. For this reason, the process ensures that U-shaped terminal electrodes capable of packaging will be formed. Since it is possible to regulate the attenuation of the irradiation light by controlling the composition of the atmosphere gas, it is possible to control the depth of the light exposure, thereby making it possible to change the area of an electrode formed on a side face of a chip substrate.

Figure 2:
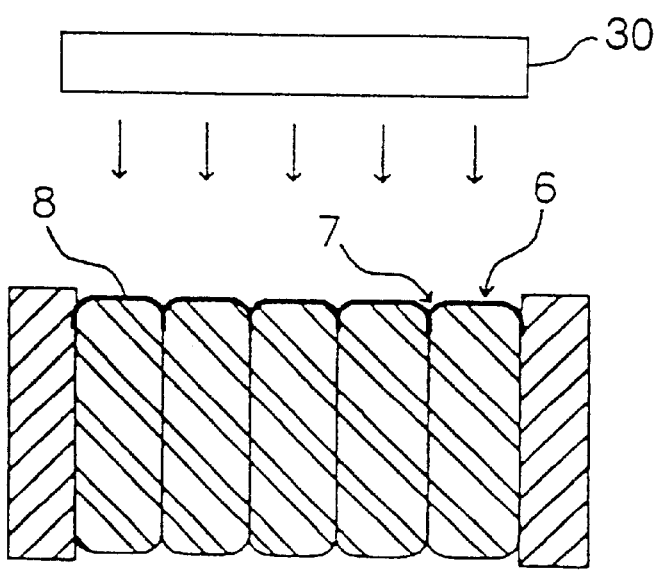
FIG. 2 is a cross sectional view showing a second embodiment of the present invention wherein a plurality of arranged chip substrates are irradiated by a light, with the use of a method of manufacturing chip-like electronic parts, according to one embodiment of the present invention.

When the chip type electronic parts are chamfered, as shown in FIG. 2, they are arranged in a manner such that the end faces thereof are orientated in an identical direction so as to be exposed. Once an irradiation light is caused to irradiate the end faces from above, both the end faces 6 and the chamfer portions 7 will be exposed, thereby precipitating a palladium catalyst which is active with respect to irradiated portions of the photo-sensitive film (the precipitated portions of the palladium catalyst are represented by a thick line 8). Therefore, when using chamfered chip type electronic parts, since the end faces and the chamfer portions of the chip substrates are exposed simultaneously and exactly with a single light irradiation, it is possible to form the U-shaped terminal electrodes in an extremely simple process.

Next, since the opposite end face of each chip substrate is to be irradiated in a similar manner, the chip substrates have to be turned upside down in a manner such that the opposite end face of each chip is orientated upwardly. Then, the light irradiation is performed so as to precipitate an active catalyst on the photo-sensitive film of the chip substrate. The chip substrate arranging method and the light irradiating method are the same as those described above. Alternatively, the active catalyst may be precipitated on opposite end faces of each chip substrate simply by performing the light exposures from above and below without reversing the chip substrate. Such light exposures may be performed serially or simultaneously.

Afterwards, portions of the photo-sensitive film which have not been irradiated by the irradiation light are washed with flowing water.

Subsequently, the chip substrates are dipped in an electroless nickel plating bath for preferably 10 minutes, so as to effect an electroless nickel plating on the portions where the above palladium catalyst has been precipitated. Then, the chip substrates are dipped in an electroless copper plating bath for preferably 10 minutes so as to effect an electroless copper plating on the above nickel-plated portions. Finally, the chip substrates are dipped in an electroless silver plating bath for 5 minutes so as to effect an electroless silver plating on the above copper plated portions, thus obtaining the chip type electronic parts, each of which has on either end thereof a terminal electrode of three-layer structure of nickel/copper/silver.

However, with respect to the electroless plating, when the active catalyst liquid is to be applied to the plated object, the plated object is dipped in a bath filled with the active catalyst liquid, thereby performing the plating on the activated portion. Therefore, electroless plating is not generally used to plate a pattern having a microstructure, but is used to plate large areas. However, in accordance with the present embodiment, it is possible to perform a plating of terminal electrodes on extremely small portions of the chip type electronic parts.

Further, the present invention which involves the use of a photo-active catalyst, when compared with a conventional method using a conventional active catalyst such as in the above conventional art 3, enables the plating film to have a high adhering strength with respect to a plated object. Therefore, it is possible to obtain terminal electrodes having a good soldering adhesion during packaging operation.

EXAMPLE 2

Figure 3:
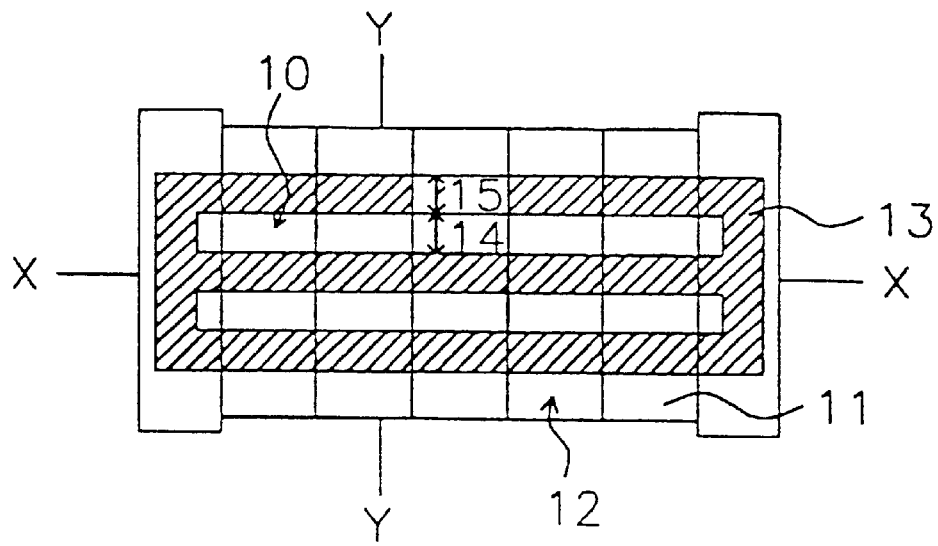
FIG. 3 is a top plan view indicating a process in which a plurality of arranged chip substrates are irradiated by a light, with the use of a method of manufacturing chip-like electronic parts, according to one embodiment of the present invention.
Figure 4:
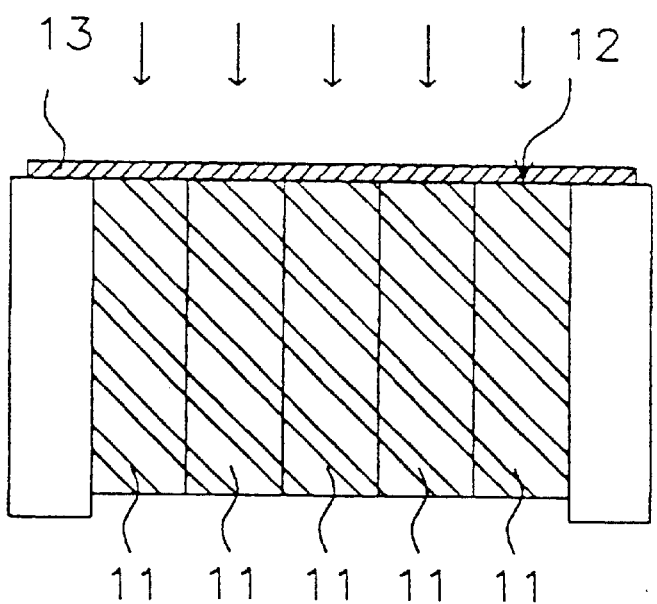
FIG. 4 is a cross sectional view taken along X—X line in FIG. 3.
Figure 5:
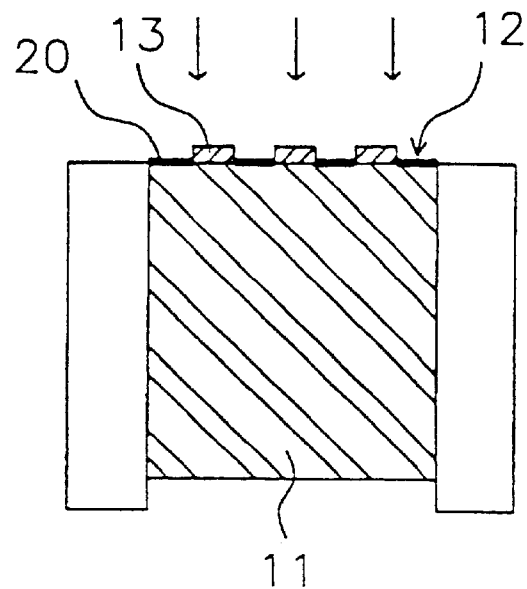
FIG. 5 is a cross sectional view taken along Y—Y line in FIG. 3.

A second embodiment of the present invention will be described with reference to FIGS. 3 to 5. FIG. 3 is a top plan view showing the arrangement of chip substrates 11. FIG. 4 is a cross sectional view taken along X—X line in FIG. 3. FIG. 5 is a cross sectional view taken along Y—Y line in FIG. 3.

In this embodiment, a photo-mask 13 is formed on the substrates 11 which are then irradiated with light, so that active palladium catalyst may be precipitated on the irradiated portions of the photo-sensitive film. More particularly, a photo-mask 13 having rod-like light transmissible portions 10 is formed on the end faces 12 of the arranged chip substrates 11 such that the photo-mask 13 is tightly attached to the end faces 12 of the chip substrates 11. The height 14 of the transmissible portions 10 and the height 15 of the non-transmissible portions of the photo-mask 13 are, for example, 100 $\mu$m each. Using this photo-mask to selectively activating the photo-sensitive film, it is possible to form a plurality of terminal electrodes on the chip substrates 11. The number of the terminal electrodes will be determined by the number of the transmissible portions 10 formed in the photo-mask 13 and the shapes of the terminal electrodes will be determined by the shapes of the transmissible portions 10.

The process of forming a photo-sensitive film consisting of a photo-active catalyst liquid on the chip substrates, the process of arranging the chip substrates in a manner such that some portions of the chip substrates for forming said electrodes will be irradiated by an irradiation light, and the process in which the chip substrates are dipped in an electroless plating bath so as to precipitate plating metal on the above activated portions, are the same as those in Example 1.

Using the above processes, chip type electronic parts having a plurality of terminal electrodes are accurately formed.

EXAMPLE 3

Figure 6:
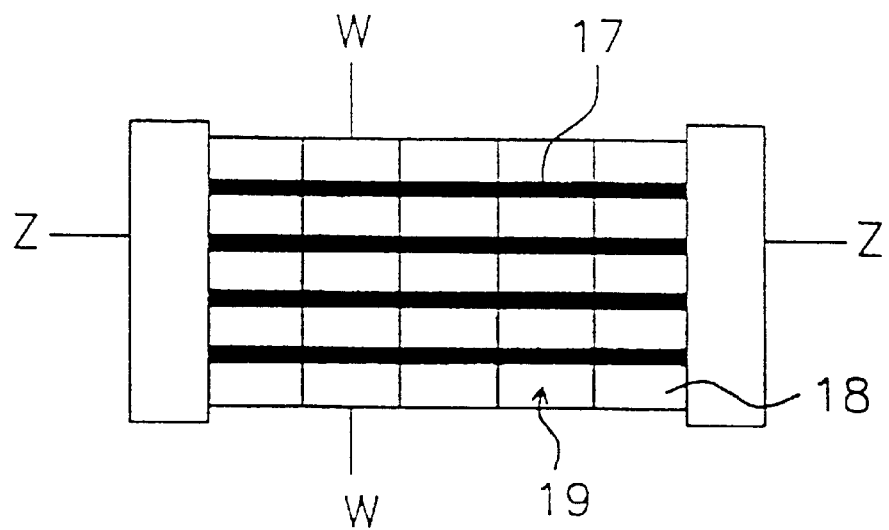
FIG. 6 is a top plan view indicating a process in which a plurality of arranged chip substrates are irradiated by a light, with the use of a method of manufacturing chip-like electronic parts, according to one embodiment of the present invention.
Figure 7:
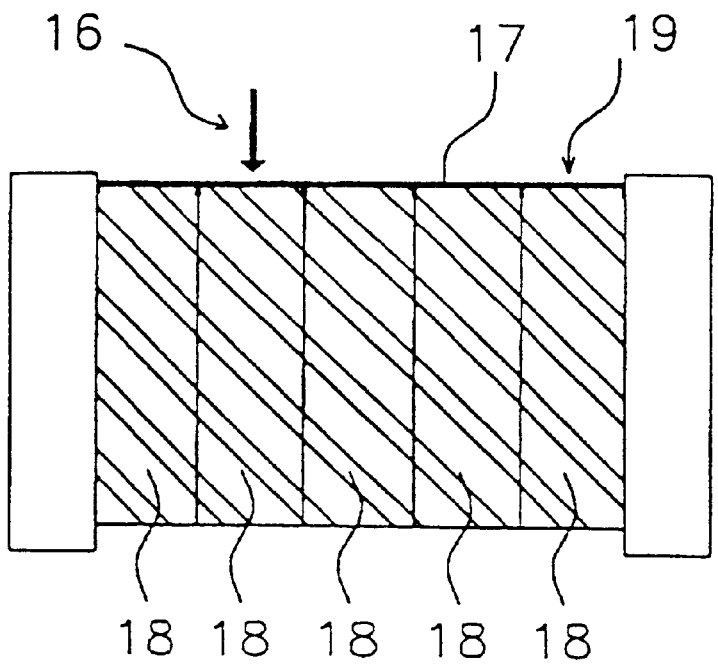
FIG. 7 is a cross sectional view taken along Z—Z line in FIG. 6.
Figure 8:
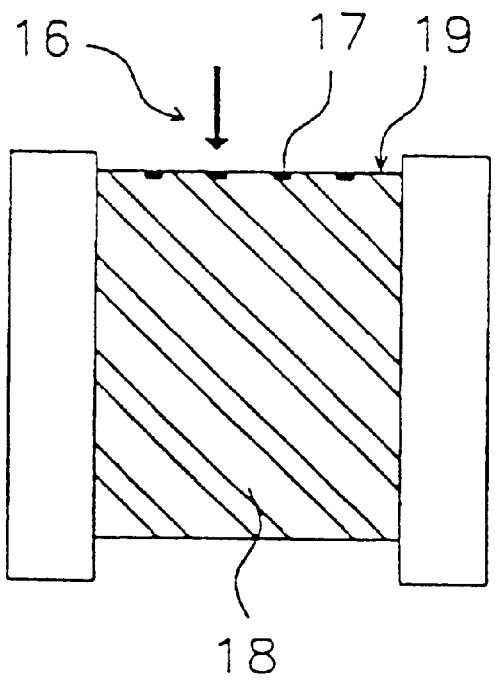
FIG. 8 is a cross sectional view taken along W—W line in FIG. 6.

A third embodiment of the present invention will be described with reference to FIGS. 6 to 8. FIG. 6 is a top plan view of an arrangement of chip substrates. FIG. 7 is a cross sectional view taken along Z—Z line in FIG. 6. FIG. 8 is a cross sectional view taken along W—W line in FIG. 6.

In this example, a laser beam 16 (rather than an exima lamp) is used to irradiate the chip substrates 11 and precipitate an active palladium catalyst on the irradiated portions of the photo-sensitive films (the precipitated portions of the palladium catalyst being represented by a thick line 17). More particularly, an exima laser beam (preferably of a wave length: 193 nm or 248 nm) is preferably used to perform the radiation in a direction passing through the end faces 19 of the arranged chip substrates 18. The diameter of the laser beam may be set to be, for example, 50 µm.

By creating relative movement between the laser beam 16 and the chip substrates 11, it is possible to selectively activate desired areas of the photo-sensitive film. Therefore, it is possible to form terminal electrodes having a microstructure without the necessity of using a photo-mask, with the shapes and number of the terminal electrodes thus form being determined by the areas irradiated by the laser beam 16.

The process of forming a photo-sensitive film consisting of a photo-active catalyst liquid on the chip substrates, the process of arranging the chip substrates in a manner such that some portions of the chip substrates for forming said electrodes will be irradiated by an irradiation light, and the process in which the chip substrates are dipped in an electroless plating bath so as to precipitate plating metal on the above activated portions, are the same as those in Example 1.

Using the foregoing process, chip type electronic parts having a plurality of terminal electrodes may be accurately formed.

EXAMPLE 4

Figure 9:
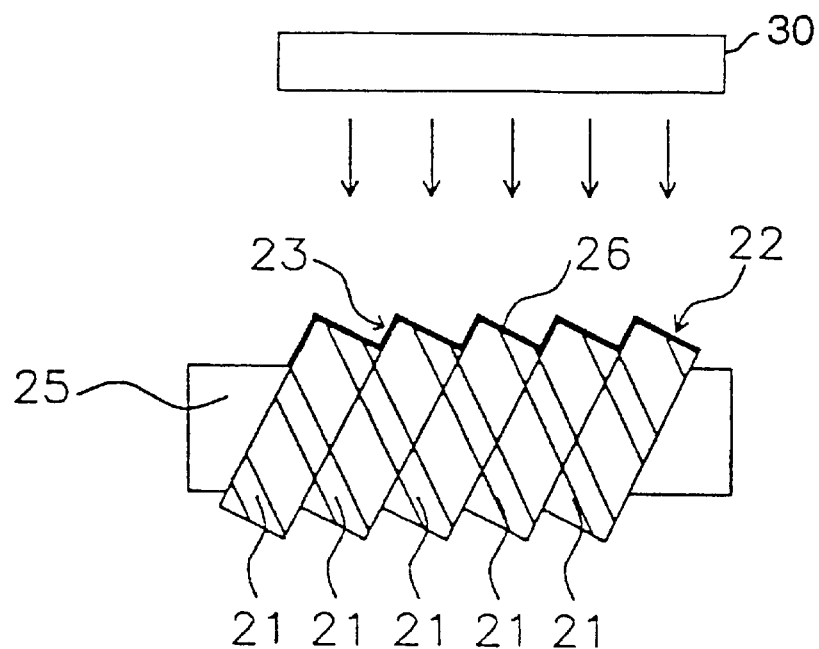
FIG. 9 is a cross sectional view indicating a process in which a plurality of arranged chip substrates are irradiated by a light, with the use of a method of manufacturing chip-like electronic parts, according to one embodiment of the present invention.

A fourth embodiment of the present invention will be described with reference to FIG. 9 and FIG. 10.

First, chip substrates 21 consisting of a ceramic such as barium titanate and titan oxide are either dipped in a hydrophilic photo-active catalyst liquid or coated with the hydrophilic photo-active catalyst liquid by first changing said liquid into a smog like medium and then spraying them on to the surfaces of the substrate, followed by a drying treatment, thereby obtaining a photo-sensitive film consisting of the photo-active catalyst liquid. Here, as the photo-active catalyst liquid, it is allowed to use a hydrophilic photo-active catalyst liquid consisting of zinc oxalate or zinc lactate, copper oxalate or copper lactate, palladium chloride and an aqueous ammonia.

Next, the chip substrates are arranged in a manner such that the portions of the chip electrodes on which electrodes are to be formed will be irradiated. As shown in FIG. 9, a plurality of chip substrates 21 are arranged in an inclined state where both the edge surfaces 22 and a portion 23 of one of the main surfaces of the chip substrates 21 are exposed to irradiation light. The chip substrates 21 are fixed in the holder 25 without any space between the chip substrates.

Next, the chip substrates 21 are irradiated from above with a light irradiating, so as to precipitate an active palladium catalyst on the irradiated portions of the photo-sensitive film (the precipitated portions of the palladium catalyst are represented by a thick line 26). More particularly, an ultraviolet light from an exima lamp (wave length: 172 nm, 222 nm or 308 nm) is preferably used to perform the irradiation with a light exposure amount of preferably 50 mJ/cm$^2$.

Figure 10:
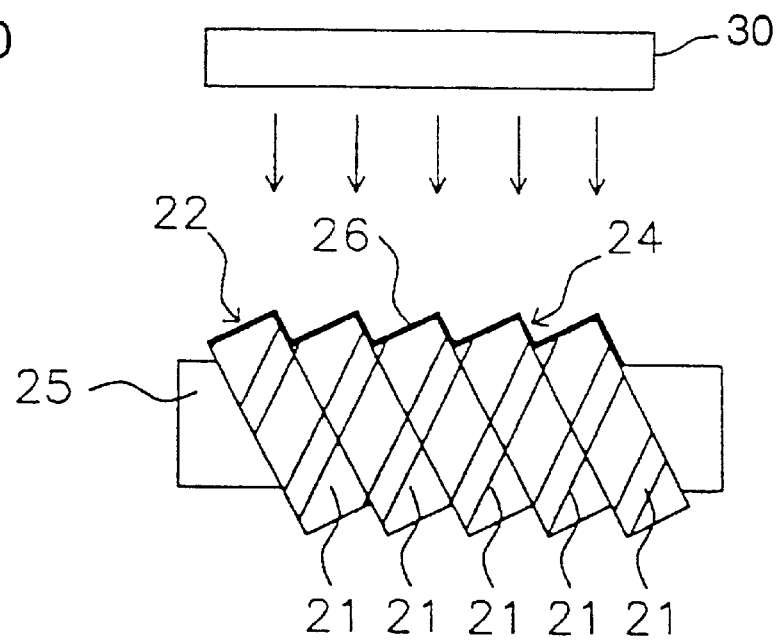
FIG. 10 is a cross sectional view indicating a process in which a plurality of arranged chip substrates are irradiated by a light, with the use of a method of manufacturing chip-like electronic parts, according to one embodiment of the present invention.

Then, as shown in FIG. 10, the chip substrates 21 are arranged with the opposite inclination such that other main surfaces 24, opposite to the above main surfaces 23, are irradiated by the light irradiation to precipitate the palladium catalyst on the irradiated portions of the photo-sensitive film. The light irradiation may be performed in the same manner as in the above.

Next, since the end face on the opposite end of each chip substrate 21 is to be irradiated with the irradiation light in a similar manner, the chip substrates are turned upside down so that the opposite end face of each chip is orientated upwardly. Then, the chip substrates 21 are irradiated from above so as to precipitate an active catalyst on the photo-sensitive film of the chip substrates 21. Finally, the chip substrates 21 are arranged with the opposite inclination and irradiated from above to precipitate an active catalyst on the photo-sensitive film of the opposite main face of the chip substrates 21. The chip substrate arranging method and the light irradiating method are the same as those described above. Alternatively, the active catalyst may be precipitated on opposite end faces of each chip substrate simply by exposing the chips from above and below without reversing the orientation of the chip substrates. Such light exposures may be performed sequentially or simultaneously.

Afterwards, portions of the photo-sensitive film which have not been irradiated are washed with a flowing water. Subsequently, the chip substrates are dipped in an electroless nickel plating bath for preferably 10 minutes, so as to effect an electroless nickel plating on the portions where the above palladium catalyst has been precipitated. Then, the chip substrates are dipped in an electroless copper plating bath for preferably 10 minutes so as to effect an electroless plating on the above nickel plated portions. Finally, the chip substrates are dipped in an electroless silver plating bath for 5 minutes so as to effect an electroless plating on the above copper plated portions, thus obtaining the chip type electronic parts, each of which has on either end thereof a U-shaped terminal electrode.

In this way, according to the present embodiment, by improving a method of arranging the chip substrates without using the photo-mask, it is possible to selectively activate the areas on which the photo-sensitive films are desired, thus forming U-shaped terminal electrodes on the chip substrates. Further, in the present embodiment, by regulating an inclination for arranging the chip substrates, it is possible to freely change the areas of the electrodes to be formed on the side surface portions of the chip substrates.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method of manufacturing chip type electronic parts, comprising the acts of:

forming a photo-sensitive film consisting of a photo-active catalyst liquid on chip substrates of chip type electronic parts;

arranging said chip substrates relative to a light source such that portions of said chip substrates on which electrodes are to be formed will become irradiated by light from said light source;

irradiating said chip substrates with a light from said light source so as to activate irradiated portions of said photo-sensitive film; and dipping said chip substrates in an electroless plating bath and precipitating a plating metal on said activated portions;

wherein said act of arranging said chip substrates comprises an act of arranging a plurality of chip substrates in an inclined manner so that both end surfaces and portions of main surfaces of said chip substrates will be exposed to said irradiated light.

2. A method of manufacturing chip type electronic parts according to claim 1, characterized in that said step of irradiating light onto said chip substrates is a step in which substantially parallel light is used as an irradiation light.

3. A method of manufacturing chip type electronic parts according to claim 2, characterized in that said step of irradiating light onto said chip substrates is a step in which an ultraviolet light is used as the irradiation light.

4. A method of manufacturing chip type electronic parts according to claim 3, characterized in that said step of irradiating a light on to said chip substrates is a step in which a photo-mask is used to selectively activate the photo-sensitive film.

5. A method of manufacturing chip type electronic parts according to claim 3, characterized in that said step of irradiating a light on to said chip substrates is a step in which a laser beam is used as the irradiation light so as to selectively activate the photo-sensitive film.

* * * * *